(12) United States Patent
Paik et al.

(10) Patent No.: US 6,188,129 B1
(45) Date of Patent: Feb. 13, 2001

(54) STACKED SEMICONDUCTOR CHIP PACKAGE HAVING EXTERNAL TERMINAL PADS AND STACKABLE CHIPS HAVING A PROTECTION LAYER

(75) Inventors: Kyung Wook Paik; Jin Su Kim, both of Daejon; Hyoung Soo Ko, Seoul, all of (KR)

(73) Assignee: Hyundai Electronics Industries Co., Ltd., Kyoungki-Do (KR)

( * ) Notice: Under 35 U.S.C. 154(b), the term of this patent shall be extended for 0 days.

(21) Appl. No.: 09/046,136

(22) Filed: Mar. 23, 1998

(30) Foreign Application Priority Data

Mar. 24, 1997 (KR) ................................................ 97/10082

(51) Int. Cl.[7] ........................... H01L 23/02; H01L 29/06; H01L 23/522
(52) U.S. Cl. ........................... 257/686; 257/685; 257/723; 257/730; 257/777; 257/692; 257/693; 257/738; 257/700; 257/758
(58) Field of Search .................................. 257/686, 685, 257/737, 738, 758, 700, 701, 723, 672, 693, 777

(56) References Cited

U.S. PATENT DOCUMENTS

| 5,073,814 | * | 12/1991 | Cole, Jr. et al. ........................ 257/643 |
| 5,104,820 | | 4/1992 | Go et al. ................................ 438/109 |
| 5,161,093 | * | 11/1992 | Gorczyca et al. ..................... 361/795 |
| 5,279,991 | | 1/1994 | Minahan et al. ....................... 438/109 |
| 5,324,687 | * | 6/1994 | Wojnarowski ......................... 438/107 |
| 5,397,916 | * | 3/1995 | Normington ........................... 257/686 |
| 5,434,751 | * | 7/1995 | Cole, Jr. et al. ....................... 361/792 |
| 5,455,459 | * | 10/1995 | Fillion et al. .......................... 257/760 |
| 5,497,033 | * | 3/1996 | Fillion et al. .......................... 257/723 |
| 5,561,622 | * | 10/1996 | Bertin et al. ............................. 365/51 |
| 5,675,180 | * | 10/1997 | Pedersen et al. ...................... 257/685 |
| 5,726,492 | * | 3/1998 | Suzuki et al. .......................... 257/685 |
| 5,825,080 | * | 10/1998 | Imaoka et al. ......................... 257/659 |
| 5,861,666 | * | 1/1999 | Bellaar .................................. 257/686 |
| 5,907,178 | * | 5/1999 | Baker et al. ........................... 257/433 |
| 5,910,682 | * | 6/1999 | Song ...................................... 257/685 |

* cited by examiner

Primary Examiner—Alexander O. Williams
(74) Attorney, Agent, or Firm—Birch, Stewart, Kolasch & Birch, LLP

(57) ABSTRACT

The stackable semiconductor chip includes a semiconductor chip having pads on an upper surface thereof, and an adhesive formed on lateral surfaces of the semiconductor chip. A first insulation layer is formed over the upper surface of the semiconductor chip and the adhesive, and defines a plurality of through holes which expose the pads. Metal lines, formed on the first insulation layer, are connected to a respective one of the pads via a respective one of the through holes. A protective layer is formed on the metal lines and the first insulation layer. A plurality of stackable semiconductor chips are stacked by disposing double-sided adhesive between the stackable semiconductor chips. Then a plurality of external terminal pads are formed on one of the lateral surfaces of the stack of stackable semiconductor chips. Each external terminal pad is electrically connected to at least one of the metal lines in one of the stackable semiconductor chips. Next, a solder ball is formed on each of the plurality of external terminal pads to produce a stacked semiconductor chip package.

16 Claims, 10 Drawing Sheets

STACKED SEMICONDUCTOR CHIP PACKAGE HAVING EXTERNAL TERMINAL PADS AND STACKABLE CHIPS HAVING A PROTECTION LAYER

BACKGROUND OF THE INVENTION

1. Field of the Invention

The present invention relates to a stackable semiconductor chip, stacked semiconductor chip package and fabrication methods thereof.

2. Description of the Conventional Art

Generally, the three-dimensional chip stacking technique is a key technique for developing a high capacity and small-sized semiconductor chip package. This technique is disclosed in U.S. Pat. No. 5,104,820 and U.S. Pat. No. 5,279,991.

FIG. 1 illustrates a portion of the three-dimensional chip stacking technique disclosed in U.S. Pat. No. 5,104,820. As shown, a wafer 2 is divided into a plurality of semiconductor chips 11 by separation lines 4. The pads 12 for one of the semiconductor chips 11 is also shown. A conductive wire 13 is connected to each one of the pads 12, and terminates in a realigned pad 14. In this manner, the pads 12 are realigned. Unfortunately, realigning the pads 12 requires forming conductive wires 13 over adjacent semiconductor chips 11, rendering those chips unusable. Thus, the yield for the wafer 2 is also significantly reduced.

Next, the semiconductor chips 11 are cut along the separation lines 4. The semiconductor chips 11 with conductive wires 13 formed thereon, however, are not separated from the semiconductor chip 11 having the pads 12; the conductive wires 13 being connected to the pads 12. The thusly separated chips 11 are stacked and formed into a module. Then, the side surfaces of each chip 11 in a module are insulated from the sides of the other chips 11.

The insulation of the sides of each chip will now be explained in more detail. In the module in which padrealigned chips are stacked in multiple layers, the side surfaces of each chip are etched except for end portions of the conductive wires 13, and a polymer insulation is filled in the etched portions; thus insulating the side surfaces of each chip. Namely, the side surface insulation process is not performed in the wafer state but is performed on the stacked chip module.

The disadvantages of the conventional three-dimensional chip stacking technique disclosed in U.S. Pat. No. 5,104,820 will now be explained. First, since many processes are performed on each stacked chip module, it is impossible to adapt conventional wafer processing techniques thereto. Second, the yield of the wafer, as discussed above, is significantly reduced (about six-fold).

Third, in order to insulate the laterally realigned pads, additional process step such as chip etching and insulation polymer coating are needed; thus increasing the fabrication cost of the semiconductor chip.

In the three-dimensional chip stacking technique disclosed in U.S. Pat. No. 5,279,991, the chips with laterally realigned pads are all stacked to form a bigger unit than a module of chips, and then the lateral surfaces of each chip are insulated. This big stacked chip unit is separated into stacked chip modules. Again, this technique requires performing many processes on the big stacked chip unit. It is impossible to directly adapt conventional wafer processing techniques thereto, thus complicating processing. In addition, an increased number of equipment must be used due to the complicated processing.

SUMMARY OF THE INVENTION

Accordingly, it is an object of the present invention to provide a stackable semiconductor chip, stacked semiconductor chip package and fabrication methods thereof which overcome the aforementioned problems and disadvantages of the conventional art.

It is another object of the present invention to provide an improved stackable semiconductor chip, stacked semiconductor chip package and fabrication methods thereof wherein the lateral surfaces of adjacent semiconductor chips are insulated from each other while in the wafer state.

A further object of the present invention is to provide a stackable semiconductor chip, stacked semiconductor chip package, and fabrication methods thereof which improve the yield of a wafer.

A still further object of the present invention is to provide a stackable semiconductor chip, stacked semiconductor chip package, and fabrication methods thereof which form conductive wires connected to pads of a given chip only over that given chip.

An additional object of the present invention is to provide a stacked semiconductor chip package and fabrication methods thereof which stack semiconductor chips packages having insulated lateral surfaces.

These and other objects are achieved by providing a stackable semiconductor chip package, comprising: a semiconductor chip having pads on an upper surface thereof; an adhesive formed on at least lateral surfaces of said semiconductor chip; a first insulation layer formed over said upper surface of said semiconductor chip and said adhesive, and defining a plurality of through holes which expose said pads; metal lines formed on said first insulation layer, each metal line connected to a respective one of said pads via a respective one of said through holes; and a protection layer formed on said metal lines and said first insulation layer.

These and other objects are also achieved by providing a module of stackable semiconductor chips, comprising: a plurality of stackable semiconductor chips stacked one on top of another with double-sided adhesive disposed between said stackable semiconductor chips, each one of said stackable semiconductor chips including, a semiconductor chip having pads on an upper surface thereof, an adhesive formed on at least lateral surfaces of said semiconductor chip, a first insulation layer formed over said upper surface of said semiconductor chip and said adhesive, and defining a plurality of through holes which expose said pads, metal lines formed on said first insulation layer, each metal line connected to a respective one of said pads via a respective one of said through holes, and a protection layer formed on said metal lines and said first insulation layer; and a plurality of external terminal pads formed on at least one lateral surface of said stack of stackable semiconductor chips, each one of said external terminal pads electrically connected to at least one of said metal lines in one of said stackable semiconductor chips.

These and other objects are further achieved by providing a method of manufacturing a semiconductor chip package, comprising: forming grooves between semiconductor chips of wafer, each semiconductor chip having pads formed on an upper surface thereof; filling said grooves with an adhesive; forming a first insulation layer over said first adhesive and said semiconductor chips; forming through holes in at least said first insulation layer to expose said pads on said semiconductor chips; forming metal lines on said first insulation layer, each metal line over one of said semiconductor chips being connected to a respective one of said pads on said one of said semiconductor chips; and forming a protective layer on said first insulation layer and said metal lines; removing a bottom surface of said wafer until said first adhesive is exposed; and cutting said wafer along said grooves to separate said wafer into stackable semiconductor chips.

These and other objectives are still further achieved by providing an method of manufacturing a semiconductor chip as described above which further comprises: stacking a plurality of said stackable semiconductor chips by disposing double-sided adhesive between said stackable semiconductor chips; and forming a plurality of external terminal pads on at least one lateral surface of said stack of stackable semiconductor chips, each terminal pad electrically connected to at least one of said metal lines in one of said stackable semiconductor chips.

Other objects, features, and characteristics of the present invention; methods, operation, and functions of the related elements of the structure; combination of parts; and economies of manufacture will become apparent from the following detailed description of the preferred embodiments and accompanying drawings, all of which form a part of this specification, wherein like reference numerals designate corresponding parts in the various figures.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The stacked chip package and the fabrication method thereof according to the present invention will now be described in detail with reference to the accompanying drawings.

Figure 1:
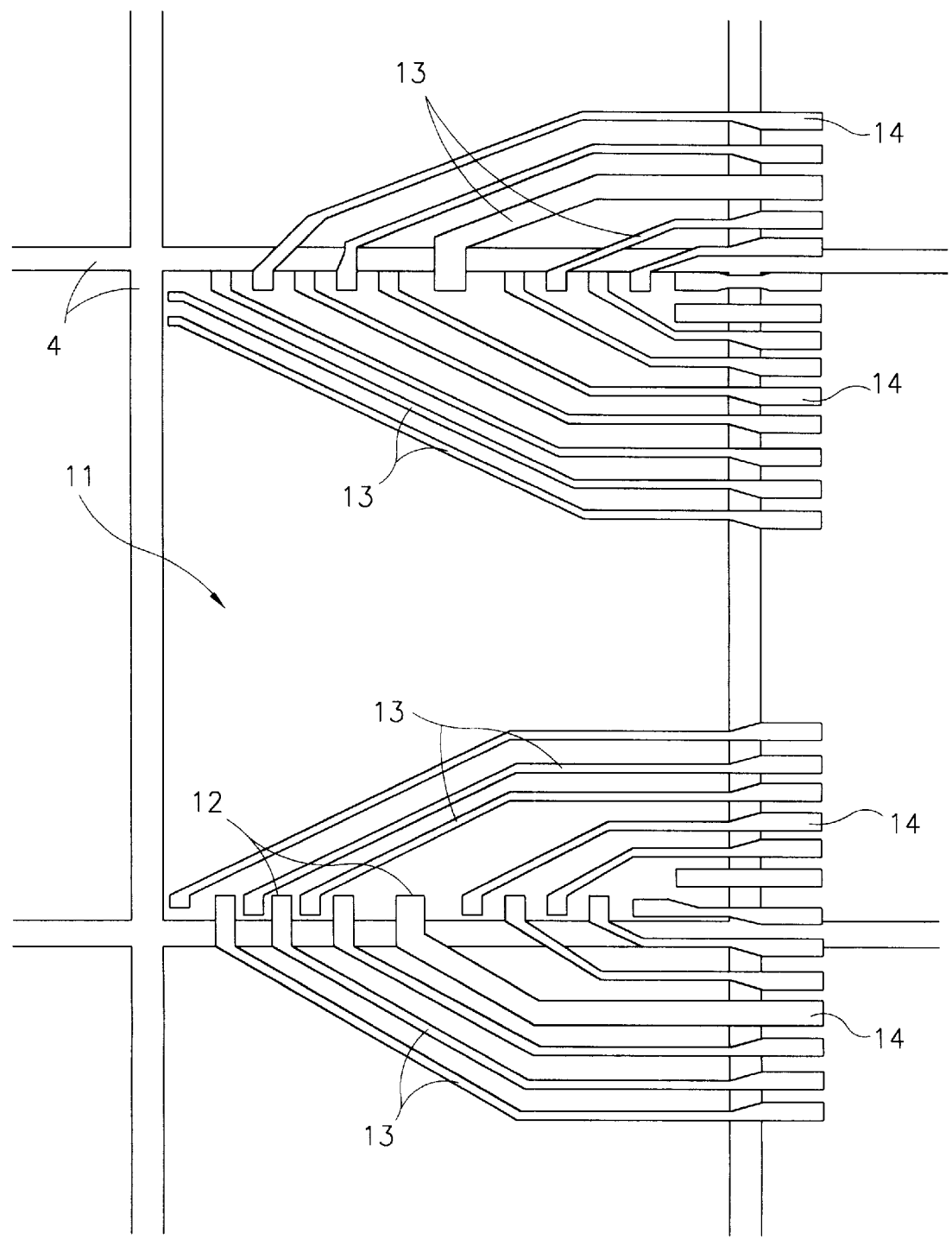
FIG. 1 is a plan view depicting a lateral surface realignment of pads in a conventional three-dimensional chip stacking technique.
Figure 2:
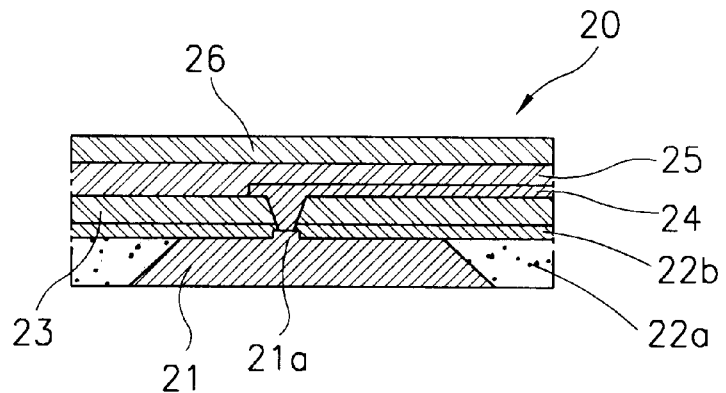
FIG. 2 is a vertical cross-sectional view illustrating a stackable semiconductor chip according to the present invention.

FIG. 2 illustrates a stackable semiconductor chip according to the present invention. The stackable semiconductor chip 20 is structured such that a plurality of stackable semiconductor chips 20 can be stacked.

With reference to FIG. 2, the construction of the stackable semiconductor chip 20 will now be explained in more detail. A semiconductor chip (bare chip) 21, on which at least one pad 21a is formed, is provided. Lateral surfaces of the semiconductor chip 21 are coated by an adhesive 22a. A first adhesive layer 22b is coated on the semiconductor chip 21, including pad 21a, and the adhesive 22a. A first insulation layer 23 is laminated on the upper surface of the first adhesive layer 22b. The adhesive 22a and the first adhesive layer 22b are made of a thermoplastic polymer adhesive such as polyetherimide having a glass transition temperature Tg which is less than the glass transition temperature of the first insulation layer 23. The first insulation layer 23 is formed of a polymer such as a polyimide.

A plurality of metal lines 24 are formed on the upper surface of the first insulation layer 23. The metal lines 24 are electrically connected, via a hole in first adhesive and insulation layers 22b and 23, with a corresponding pad 21a, and extend laterally from the semiconductor chip 21.

In this manner, the pad 21a, formed on the upper surface of the semiconductor chip 21, is realigned by the metal lines 24.

The metal lines 24 are formed of titanium and copper layers Ti/Cu, in which the Cu layer forms a main wiring layer and the Ti layer forms an auxiliary wiring layer for enhancing adhesion between the Cu layer and the first insulation layer 23.

Also, the metal lines 24 may be formed of titanium, copper and titanium layers Ti/Cu/Ti instead of Titanium and Copper layers Ti/Cu.

In addition, a second adhesive layer 25, made of the same material as the first adhesive layer 22b, is coated on the upper surface of the resultant structure. A second insulation layer 26, made of the same material as the first insulation layer 23, is formed on the upper surface of the second adhesive layer 25.

Figure 3:
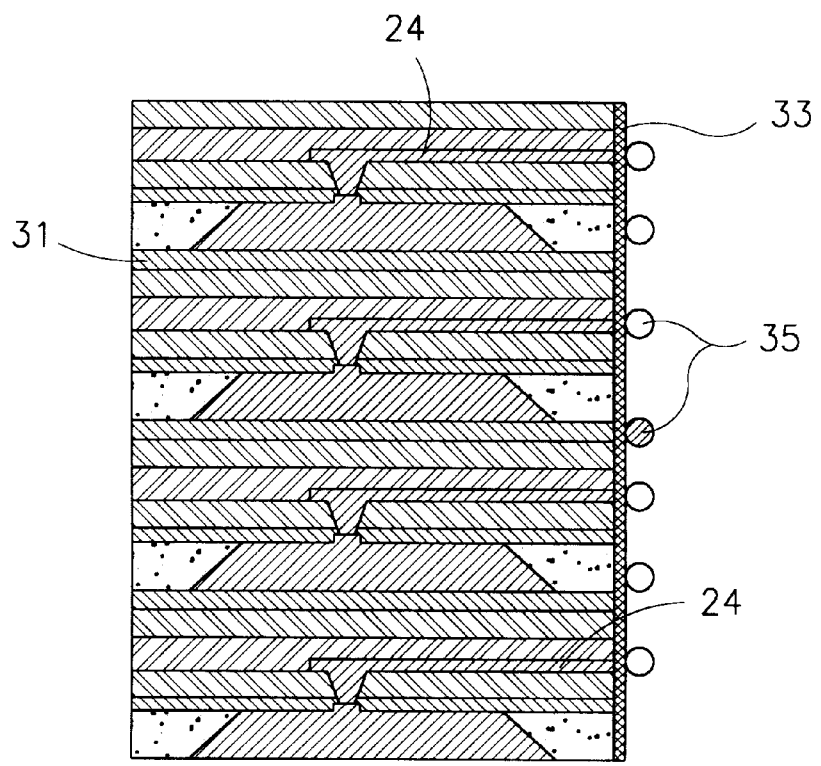
FIG. 3 is a vertical cross-sectional view illustrating a stacked semiconductor chip package according to the present invention.
Figure 3A:
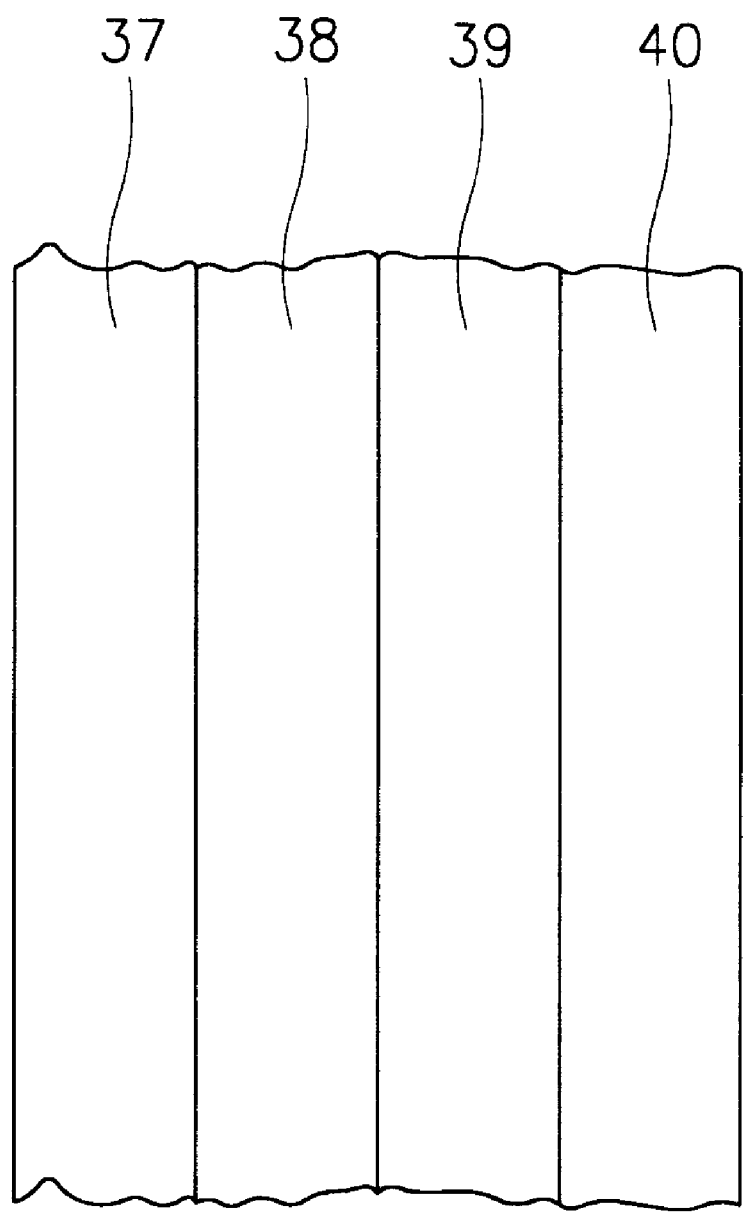
FIG. 3a is a detailed view showing the layers forming external terminal pads.
Figure 4:
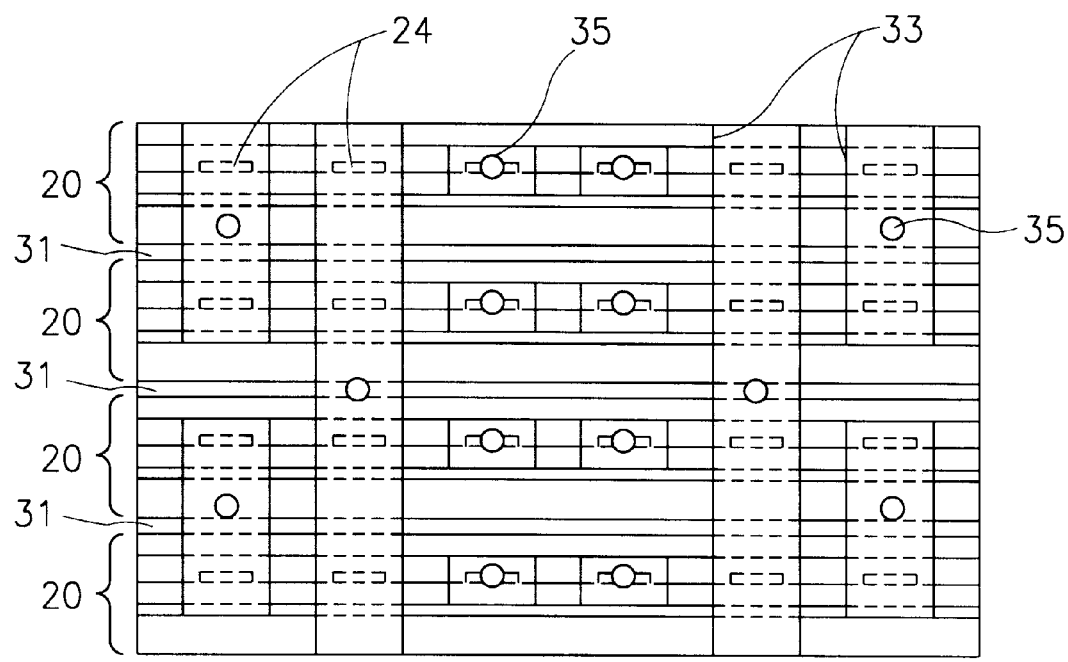
FIG. 4 is a side view of the package of FIG. 3.

FIG. 3 illustrates a stacked semiconductor chip package or module according to the present invention, and FIG. 4 illustrates a side view of the package of FIG. 3. As shown in FIGS. 3 and 4, multiple stackable semiconductor chips 20 are stacked using double-sided adhesives 31, formed by coating an epoxy resin on a polyimide film, interposed therebetween. As shown in FIG. 4, external terminal pads 33 are formed on at least one lateral surface of the module of stacked stackable semiconductor chips 20, and are electrically connected to respective laterally extending metal lines 24. Solder balls 35 are attached to the outer surfaces of the external terminal pads 33. Each external terminal pad 33 is formed of titanium, copper, nickel and gold Ti/Cu/Ni/Au layers, as shown in FIG. 3a. The Ti layer 37 is a layer for increasing adhesion, the Cu layer 38 is a main wiring layer 37, and the Ni/Au layers, as shown in FIG. 8a are layers for increasing adhesion of the solder balls 35.

The fabrication method of the stacked semiconductor chip package according to the present invention will now be explained with reference to FIGS. 5A through 5J.

Figure 5A:
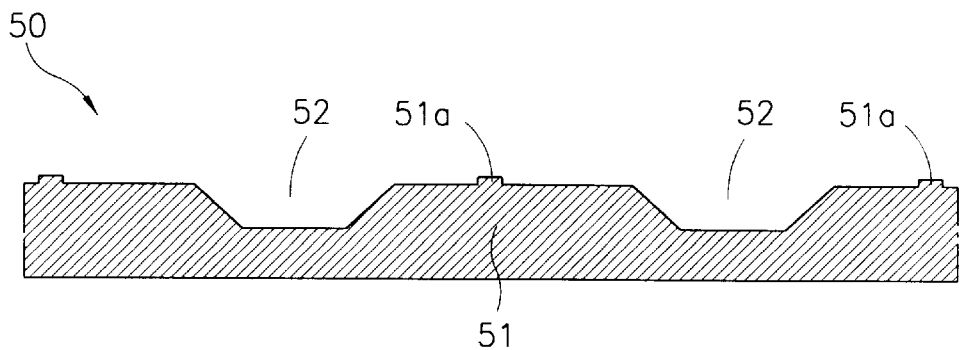
FIGS. 5A through 5J are vertical cross-sectional views showing the fabrication method of a stacked semiconductor chip package according to the present invention.

First, as shown in FIG. 5A, V-shaped grooves 52 are formed along separation lines (not shown) between semiconductor chips 51 disposed on the upper surface of a wafer 50. The grooves 52 have a depth of about 300 (m and a width of about 1000 (m. Namely, each groove 52 is formed to have a depth which is about two-thirds the thickness of the wafer 50 by using a KOH etching process or a 45( diamond slant-based cutting (sawing) process. As further shown in FIG. 5A, the semiconductor chips 51 include at least one pad 51a disposed thereon.

Figure 5B:
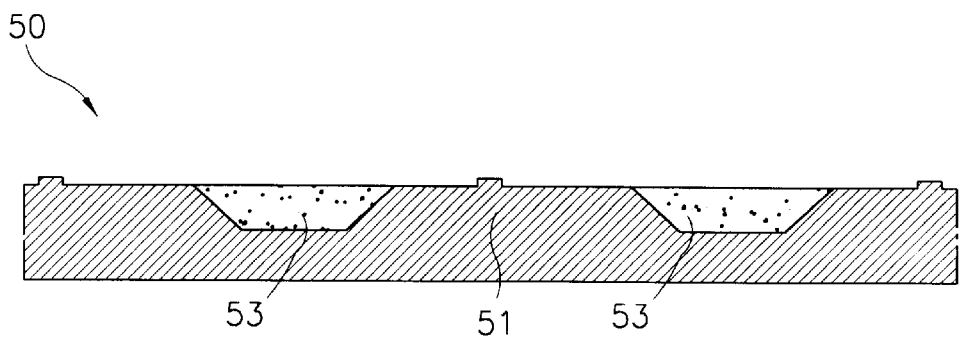

As shown in FIG. 5B, each groove 52 is filled with an adhesive 53. The adhesive 53 is obtained by continuously coating (continuously injecting) a thermoplastic adhesive, in a state that bubbles are not formed, over the wafer 50. In the present invention, a polymer adhesive such as polyetherimide is used as the thermoplastic adhesive.

Figure 5C:
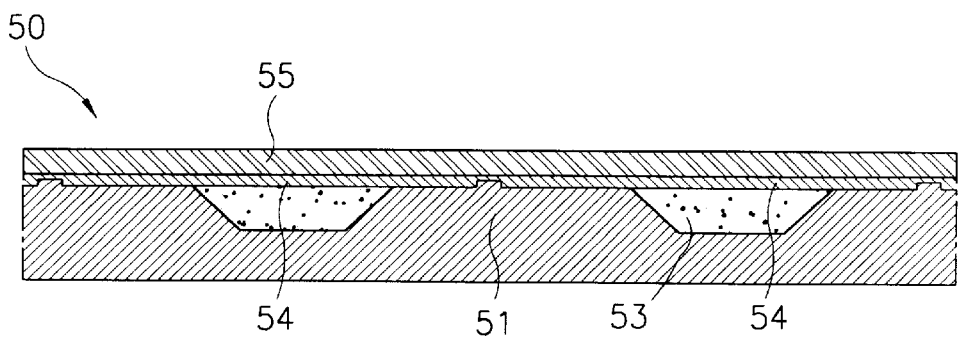

As shown in Fig. 5C, a first adhesive layer 54, formed of the same material as the adhesive 53, is further coated, and planarized by a spinning process, on the upper surface of the wafer 50. Next, a first insulation layer 55 is formed over the wafer 50. The first insulation layer 55 is formed of a polymer such as a polyimide film.

Figure 5D:
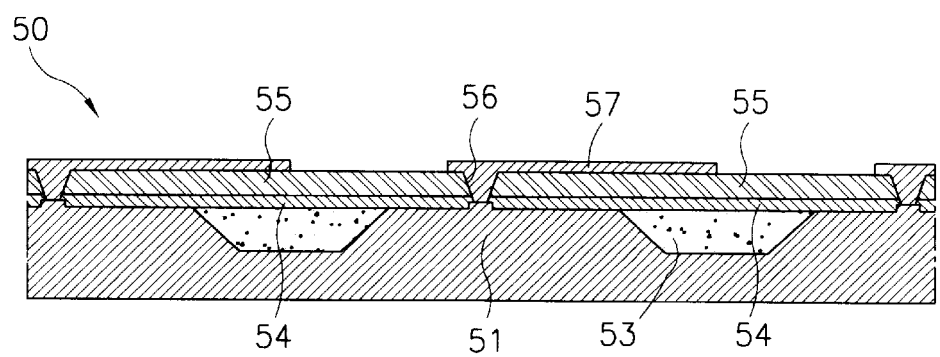

As shown in Figure 5D, through holes 56 are formed in the first adhesive and insulation layers 54 and 55 to expose the pads 51a of the semiconductor chips 51, and a first conductive layer is formed on the upper surface of the resultant structure. The first conductive layer includes a titanium Ti layer and a copper Cu layer. Thereafter, the first conductive layer is patterned to form a plurality of metal lines 57.

One end of each of the metal lines 57 is connected with a corresponding one of the pads 51a via the through holes 56, and another end of each of the metal lines 57 laterally extends from the semiconductor chip 51 to realign the pads 51a. Accordingly, after the semiconductor chips 51 are separated from each other, the pad 51a formed on the center portion of the semiconductor chip 51 is laterally re-aligned by the metal lines 57.

Figure 5E:
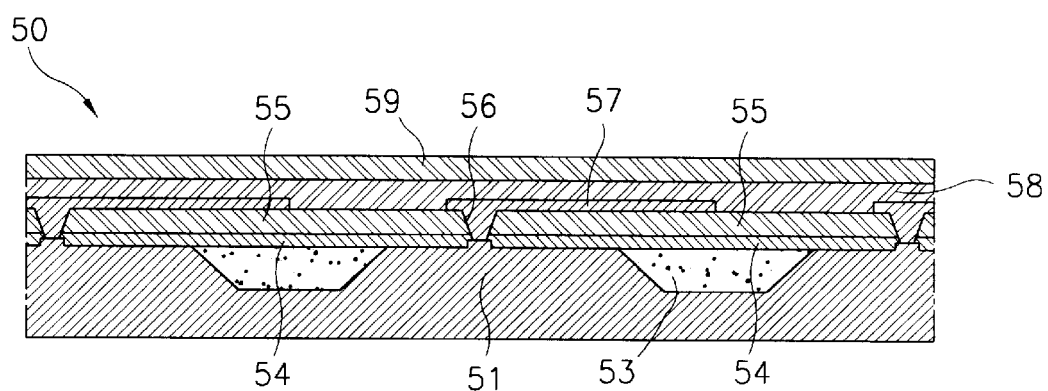

As shown in FIG. 5E, a second adhesive layer 58, made of the same material as the first adhesive layer 54, is coated on the upper surface of the resultant structure, and a second insulation layer 59, made of the same material as the first insulation layer 55, is laminated on the upper surface of the second adhesive layer 58.

Figure 5F:
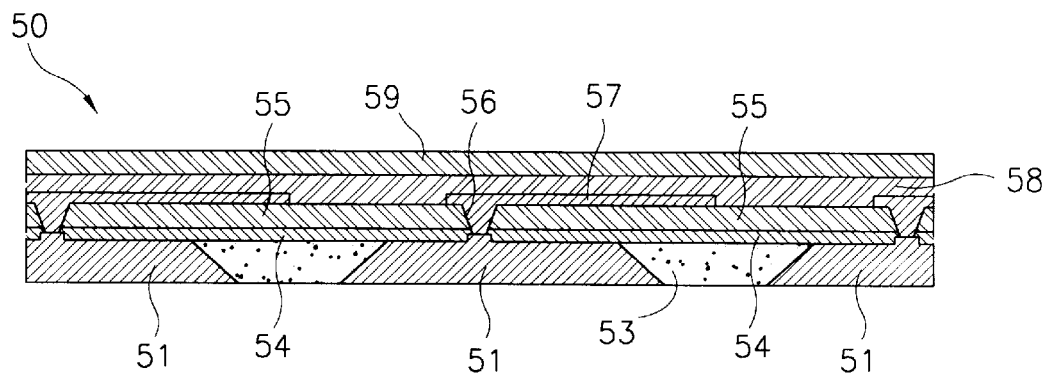

As shown in FIG. 5F, the lower surface of the resultant structure (i.e., the wafer 50) is polished. The polishing process is performed until the lower portion of the wafer 50 disposed below the adhesive 53 is fully removed, and the lower surface of the adhesive 53 is fully exposed. As a result, neighboring chips 51 are insulated from each other by the adhesive 53.

Figure 5G:
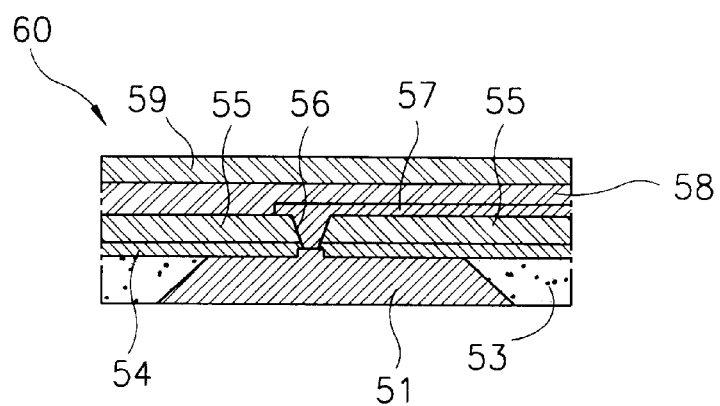

As shown in FIG. 5G, the wafer 50 is cut (sawed) along the chip sawing line, namely, the center line of the adhesive 53 filling each groove 52, using a diamond cutter (not shown), to produce multiple single stackable semiconductor chips 60. The thusly produced semiconductor chips 51 are fully insulated from each other by the adhesive 53, and become stackable semiconductor chips 20 and 60 as shown in FIGS. 2 and 5H, respectively.

Figure 6:
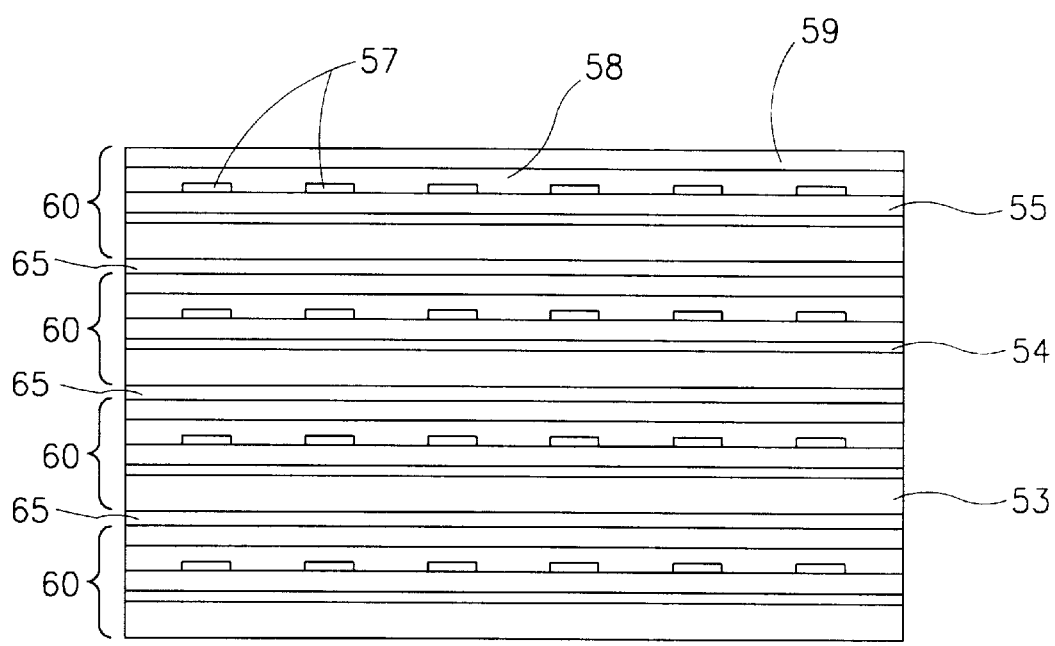
FIG. 6 is a side view of the package of FIG. 5H.

One of the lateral surfaces of the stackable semiconductor chips 20 and 60 include electrically realigned connections to the pads 51a as shown in FIG. 6.

Figure 5H:
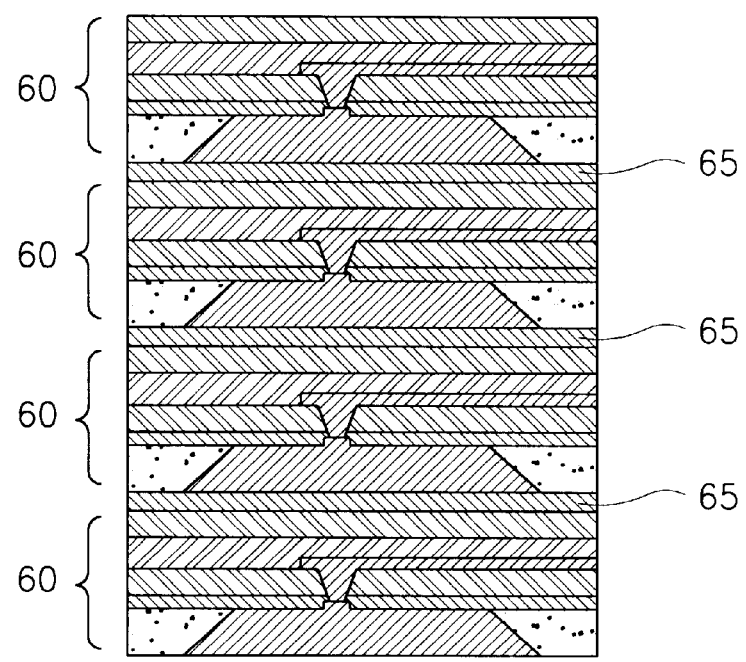

As shown in FIGS. 5H and 6, the stackable semiconductor chips 60 shown in FIG. 5G are aligned and stacked under predetermined pressure and temperature conditions using an insulating double-sided adhesive 65. Namely, in FIG. 5H, four stackable semiconductor chips 60 are stacked. As the material of the double-sided adhesive 65, a double-sided adhesive formed by coating an epoxy resin on a polyimide film is preferably used. In addition, the lateral surfaces of the resultant structure are finely polished so that the adhesive resin protruding from the lateral portions of the stacked stackable semiconductor chips 60 is removed, and at least one of the lateral surfaces is coated with a second conductive layer.

Figure 5I:
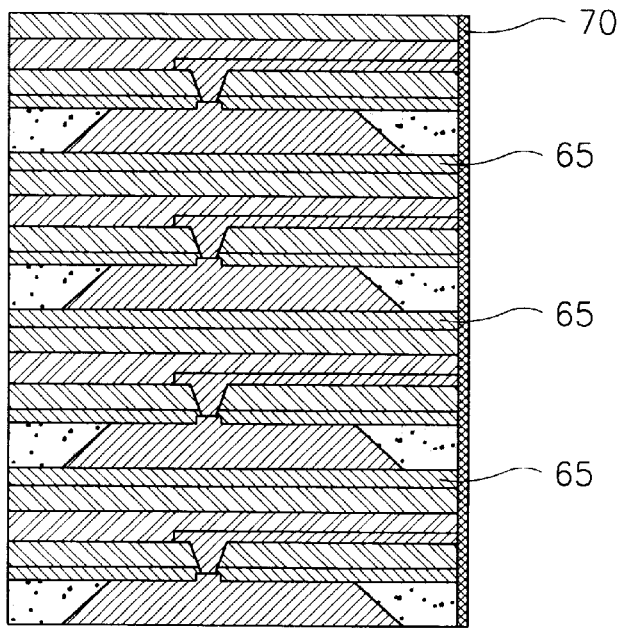
Figure 7:
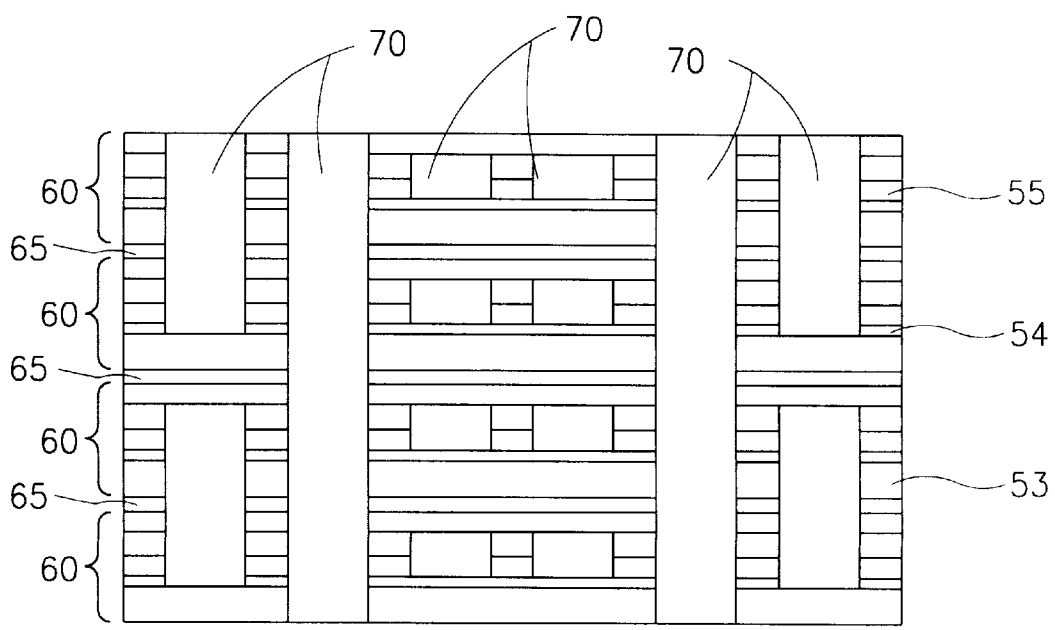
FIG. 7 is a side view of the package of FIG. 5I.

As shown in FIGS. 5I and 7, the second conductive layer, formed of titanium, copper, nickel and gold Ti/Cu/Ni/Au layers, is formed on one of the lateral surfaces of the four stacked stackable semiconductor chips 60, and patterned to form external terminal pads 70 electrically connected to respective ones of the metal lines 57. By their connection to respective ones of the metal lines 57, the external terminal pads 70 are electrically connected to respective ones of the pads 51a.

Figure 5J:
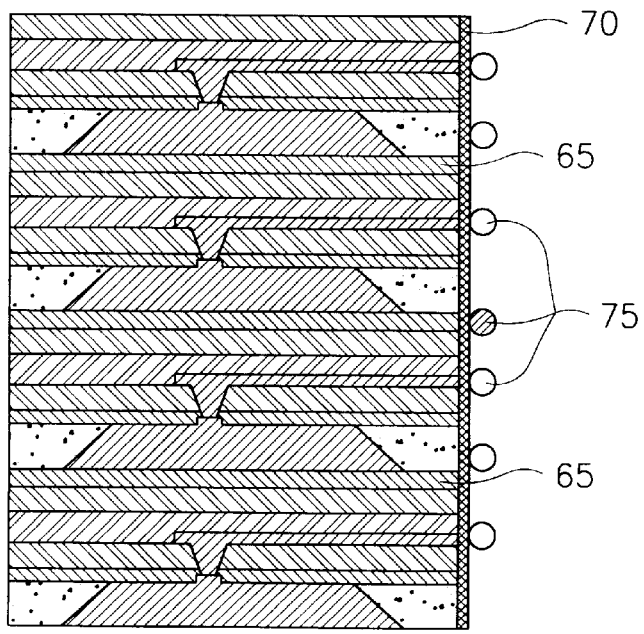
Figure 8:
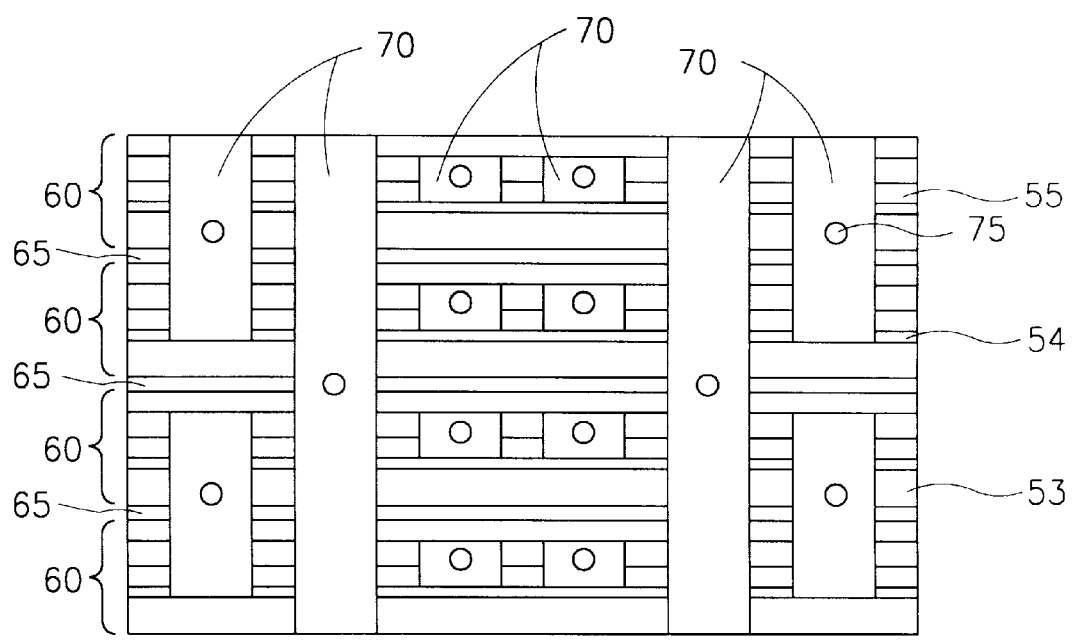
FIG. 8 is a side view of the package of FIG. 5J.

As shown in FIGS. 5J and 8, solder balls 75 are attached to the outer surfaces of the external terminal pads 70 to complete the formation of a three-dimensional stacked chip package in a Ball Grid Array (BGA).

The advantages of the stacked semiconductor chip package and the fabrication method thereof according to the present invention will now be explained. First, since almost all processes are performed on the wafer 50, it is easy to adopt known wafer processing techniques to implement the process steps of the present invention. Therefore, the fabrication processes are made easier and simpler.

Second, since semiconductor chips have their lateral surfaces coated with adhesive prior to stacking and packing, the fabrication processes according to the present invention becomes simpler and easier compared to the conventional technique of stacking the chips.

Third, when realigning the pads at the edge portion of the chip, since the areas of adjacent or neighboring chips are not used, the wafer yield is increased compared to the conventional fabrication method and it is possible to fabricate smaller stackable chips.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A module of stackable semiconductor chips, comprising:

a plurality of stackable semiconductor chips stacked one on top of another with double-sided adhesive disposed between said stackable semiconductor chips, each one of said stackable semiconductor chips including, a semiconductor chip having pads on an upper surface thereof, an adhesive formed on at least lateral surfaces of said semiconductor chip, a first insulation layer formed over said upper surface of said semiconductor chip and said adhesive, and defining a plurality of through holes which expose said pads, metal lines formed on said first insulation layer, each metal line connected to a respective one of said pads via a respective one of said through holes, and a protection layer formed on said metal lines and said first insulation layer;

a plurality of external terminal pads formed on at least one lateral surface of said stack of stackable semiconductor chips, each one of said external terminal pads electrically connected to at least one of said metal lines in one of said stackable semiconductor chips; and a solder ball formed on each of said plurality of external terminal pads.

2. The module of claim 1, wherein said adhesive is formed on lateral surfaces of said semiconductor chip and on said upper surface of said semiconductor chip.

3. The module of claim 2, wherein said protection layer includes an adhesive layer formed on said metal lines and said first insulation layer, and a second insulation layer formed on said adhesive layer.

4. The module of claim 3, wherein said adhesive and said adhesive layer are formed from the same material.

5. The module of claim 4, wherein said adhesive and said adhesive layer are formed from a thermoplastic polymer adhesive.

6. The module of claim 4, wherein said adhesive and adhesive layer are formed from a thermoplastic polymer adhesive having a glass transition temperature which is less than a glass transition temperature of said first insulation layer.

7. The module of claim 6, wherein said thermoplastic polymer adhesive is a polyetherimide.

8. The module of claim 3, wherein said first and second insulation layers are formed of the same material.

9. The module of claim 8, wherein said first and second insulation layers are formed of a polyimide.

10. The module of claim 1, wherein said metal lines include titanium and copper layers.

11. The module of claim 1, wherein said protection layer includes an adhesive layer formed on said metal lines and said first insulation layer, and a second insulation layer formed on said adhesive layer.

12. The module of claim 1, wherein said metal lines extend past one of said lateral surfaces of said semiconductor chip.

13. The module of claim 1, wherein ends of said metal lines form a portion of one of said lateral surfaces of said stack of semiconductor chip packages.

14. The module of claim 1, wherein said doublesided adhesive includes a polyimide film with and epoxy resin coated thereon.

15. The module of claim 1, wherein said external terminal pads includes a titanium layer, a copper layer, a nickel layer and a gold layer.

16. The module of claim 1, wherein said external terminal pads are formed directly on said at least one lateral surface of said stack of semiconductor chips, each pad contacting at least a protection layer and a first insulation layer of at least one of said semiconductor chips.

* * * * *